(12) United States Patent
Kubena et al.

(10) Patent No.: US 9,250,074 B1
(45) Date of Patent: Feb. 2, 2016

(54) RESONATOR ASSEMBLY COMPRISING A SILICON RESONATOR AND A QUARTZ RESONATOR

(71) Applicant: HRL Laboratories, LLC, Malibu, CA (US)

(72) Inventors: Randall L. Kubena, Oak Park, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/249,723

(22) Filed: Apr. 10, 2014

Related U.S. Application Data

(60) Provisional application No. 61/811,636, filed on Apr. 12, 2013.

(51) Int. Cl.
*G01C 19/56* (2012.01)
*H03B 5/32* (2006.01)
(Continued)

(52) U.S. Cl.
CPC ............ *G01C 19/56* (2013.01); *G01C 19/5684* (2013.01); *G01C 19/5719* (2013.01); *G01P 15/14* (2013.01); *H01L 41/053* (2013.01); *H01L 41/25* (2013.01); *H03B 1/02* (2013.01); *H03B 5/32* (2013.01); *H03H 3/02* (2013.01); *B81B 2201/0242* (2013.01); *B81C 1/00134* (2013.01); *B81C 1/00261* (2013.01)

(58) Field of Classification Search
CPC ........... G01C 19/5684; G01C 19/5719; G01C 19/56; G01P 15/14; Y10T 29/42; B81B 2201/0242; B81B 2201/0235; B81C 1/00134; B81C 1/00261; B81C 3/001; H03H 3/02; H03H 9/10; H01L 41/053; H01L 41/083; H01L 41/25; H03B 5/32; H03B 1/02
USPC ................. 73/503.3, 504.04, 504.12, 504.16; 310/311, 340; 331/158, 68
See application file for complete search history.

(56) References Cited

U.S. PATENT DOCUMENTS

| 392,650 A | 11/1888 | Watrous |
| 3,766,616 A | 10/1973 | Staudte |

(Continued)

FOREIGN PATENT DOCUMENTS

| DE | 44 42 033 | 5/1996 |
| DE | 19719601 | 11/1998 |

(Continued)

OTHER PUBLICATIONS

U.S. Appl. No. 11/818,797, filed Jun. 14, 2007, Kirby.

(Continued)

*Primary Examiner* — Ryan Johnson
(74) *Attorney, Agent, or Firm* — Ladas & Parry (57) ABSTRACT

A resonator assembly comprising a semiconductor substrate, a resonator gyroscope, the resonator gyroscope including a first resonator formed in a layer of a first material, and an oscillator on the semiconductor substrate, the oscillator including a second resonator formed of a second material, wherein the second resonator is attached in a cavity; the cavity comprising a first recess in said layer of a first material and the edges of the first recess being attached to the substrate, or the cavity comprising a second recess in said substrate and the edges of the second recess being attached to said layer of a first material.

27 Claims, 3 Drawing Sheets

(51) Int. Cl.
*H03H 3/02* (2006.01)
*H01L 41/25* (2013.01)
*H01L 41/053* (2006.01)
*G01C 19/5684* (2012.01)
*G01C 19/5719* (2012.01)
*G01P 15/14* (2013.01)
*H03B 1/02* (2006.01)
*B81C 1/00* (2006.01)

(56) References Cited

U.S. PATENT DOCUMENTS

| | | | |
|---|---|---|---|
| 4,364,016 A | 12/1982 | Tanski | |
| 4,426,769 A | 1/1984 | Grabbe | |
| 4,442,574 A | 4/1984 | Wanuga | |
| 4,618,262 A | 10/1986 | Maydan | |
| 4,870,313 A | 9/1989 | Hirama | |
| 4,898,031 A | 2/1990 | Oikawa | |
| 4,944,836 A | 7/1990 | Beyer | |
| 5,203,208 A | 4/1993 | Bernstein | |
| 5,226,321 A | 7/1993 | Varnham | |
| 5,260,596 A | 11/1993 | Dunn | |
| 5,421,312 A | 6/1995 | Dawson | |
| 5,480,747 A | 1/1996 | Vasudev | |
| 5,552,016 A | 9/1996 | Ghanayem | |
| 5,578,976 A | 11/1996 | Yao | |
| 5,589,724 A | 12/1996 | Satoh | |
| 5,604,312 A | 2/1997 | Lutz | |
| 5,605,490 A | 2/1997 | Laffey | |
| 5,644,139 A | 7/1997 | Allen | |
| 5,646,346 A | 7/1997 | Okada | |
| 5,648,849 A | 7/1997 | Canteloup | |
| 5,658,418 A | 8/1997 | Coronel | |
| 5,665,915 A | 9/1997 | Kobayashi | |
| 5,666,706 A | 9/1997 | Tomita | |
| 5,668,057 A | 9/1997 | Eda | |
| 5,728,936 A | 3/1998 | Lutz | |
| 5,783,749 A | 7/1998 | Lee | |
| 5,894,090 A | 4/1999 | Tang | |
| 5,905,202 A | 5/1999 | Kubena | |
| 5,920,012 A | 7/1999 | Pinson | |
| 5,928,532 A | 7/1999 | Koshimizu | |
| 5,942,445 A | 8/1999 | Kato | |
| 5,981,392 A | 11/1999 | Oishi | |
| 5,987,985 A | 11/1999 | Okada | |
| 6,009,751 A | 1/2000 | Ljung | |
| 6,044,705 A | 4/2000 | Neukermans | |
| 6,081,334 A | 6/2000 | Grimbergen | |
| 6,094,985 A | 8/2000 | Kapels | |
| 6,145,380 A | 11/2000 | MacGugan | |
| 6,151,964 A | 11/2000 | Nakajima | |
| 6,155,115 A | 12/2000 | Ljung | |
| 6,164,134 A | 12/2000 | Cargille | |
| 6,182,352 B1 | 2/2001 | Deschenes | |
| 6,196,059 B1 | 3/2001 | Kosslinger | |
| 6,207,008 B1 | 3/2001 | Kijima | |
| 6,250,157 B1 | 6/2001 | Touge | |
| 6,263,552 B1 | 7/2001 | Takeuchi | |
| 6,282,958 B1 | 9/2001 | Fell | |
| 6,289,733 B1 | 9/2001 | Challoner | |
| 6,297,064 B1 | 10/2001 | Koshimizu | |
| 6,349,597 B1 | 2/2002 | Folkmer | |
| 6,367,326 B1 | 4/2002 | Okada | |
| 6,367,786 B1 | 4/2002 | Gutierrez | |
| 6,413,682 B1 | 7/2002 | Shibano | |
| 6,417,925 B1 | 7/2002 | Naya | |
| 6,424,418 B2 | 7/2002 | Kawabata | |
| 6,426,296 B1 | 7/2002 | Okojie | |
| 6,432,824 B2 | 8/2002 | Yanagisawa | |
| 6,481,284 B2 | 11/2002 | Geen | |
| 6,481,285 B1 | 11/2002 | Shkel | |
| 6,492,195 B2 | 12/2002 | Nakanishi | |
| 6,513,380 B2 | 2/2003 | Reeds | |
| 6,514,767 B1 | 2/2003 | Natan | |
| 6,515,278 B2 | 2/2003 | Wine | |
| 6,584,845 B1 | 7/2003 | Gutierrez | |
| 6,614,529 B1 | 9/2003 | Tang | |
| 6,621,158 B2 | 9/2003 | Martin | |
| 6,627,067 B1 | 9/2003 | Branton | |
| 6,628,177 B2 | 9/2003 | Clark | |
| 6,629,460 B2 | 10/2003 | Challoner | |
| 6,651,027 B2 | 11/2003 | McCall | |
| 6,715,352 B2 | 4/2004 | Tracy | |
| 6,756,304 B1 | 6/2004 | Robert | |
| 6,796,179 B2 | 9/2004 | Bae | |
| 6,806,557 B2 | 10/2004 | Ding | |
| 6,815,228 B2 | 11/2004 | Usui | |
| 6,856,217 B1 | 2/2005 | Clark | |
| 6,883,374 B2 | 4/2005 | Fell | |
| 6,933,164 B2 | 8/2005 | Kubena | |
| 6,985,051 B2 | 1/2006 | Nguyen | |
| 7,118,657 B2 | 10/2006 | Golovchenko | |
| 7,152,290 B2 | 12/2006 | Junhua | |
| 7,168,318 B2 | 1/2007 | Challoner | |
| 7,237,315 B2 | 7/2007 | Kubena | |
| 7,446,461 B2 | 11/2008 | Watanabe | |
| 7,459,099 B2 | 12/2008 | Kubena | |
| 7,543,496 B2 | 6/2009 | Ayazi | |
| 7,555,824 B2 | 7/2009 | Chang | |
| 7,559,130 B2 | 7/2009 | Kubena | |
| 7,581,443 B2 | 9/2009 | Kubena | |
| 7,750,535 B2 | 7/2010 | Kubena | |
| 7,757,393 B2 | 7/2010 | Ayazi | |
| 7,884,930 B2 | 2/2011 | Kirby | |
| 7,895,892 B2 | 3/2011 | Aigner | |
| 8,151,640 B1 | 4/2012 | Kubena | |
| 2002/0066317 A1 | 6/2002 | Lin | |
| 2002/0072246 A1 | 6/2002 | Goo | |
| 2002/0074947 A1 | 6/2002 | Tsukamoto | |
| 2002/0107658 A1 | 8/2002 | McCall | |
| 2002/0185611 A1 | 12/2002 | Menapace | |
| 2003/0003608 A1 | 1/2003 | Arikado | |
| 2003/0010123 A1 | 1/2003 | Malvern | |
| 2003/0029238 A1 | 2/2003 | Challoner | |
| 2003/0196490 A1 | 10/2003 | Cardarelli | |
| 2004/0055380 A1 | 3/2004 | Shcheglov | |
| 2004/0065864 A1 | 4/2004 | Vogt | |
| 2004/0189311 A1 | 9/2004 | Glezer | |
| 2004/0211052 A1 | 10/2004 | Kubena | |
| 2005/0156309 A1 | 7/2005 | Fujii | |
| 2005/0260792 A1 | 11/2005 | Patel | |
| 2006/0016065 A1 | 1/2006 | Nagaura | |
| 2006/0213266 A1 | 9/2006 | French | |
| 2006/0252906 A1 | 11/2006 | Godschalx | |
| 2007/0017287 A1 | 1/2007 | Kubena | |
| 2007/0034005 A1 | 2/2007 | Acar | |
| 2007/0205839 A1 | 9/2007 | Kubena | |
| 2007/0220971 A1 | 9/2007 | Ayazi | |
| 2007/0240508 A1 | 10/2007 | Watson | |
| 2008/0034575 A1 | 2/2008 | Chang | |
| 2008/0074661 A1 | 3/2008 | Zhang | |
| 2008/0096313 A1 | 4/2008 | Patel | |
| 2008/0148846 A1 | 6/2008 | Whelan | |
| 2009/0189294 A1 | 7/2009 | Chang | |
| 2012/0280594 A1* | 11/2012 | Chen et al. | 310/313 R |

FOREIGN PATENT DOCUMENTS

| | | |
|---|---|---|
| EP | 0 461 761 | 12/1991 |
| EP | 0531985 | 3/1993 |
| EP | 0 971 208 | 1/2000 |
| EP | 1055908 | 11/2000 |
| JP | S57-091017 | 6/1982 |
| JP | H01129517 | 5/1989 |
| JP | H04322507 | 11/1992 |
| JP | 05286142 | 11/1993 |
| JP | 8330878 | 12/1996 |
| JP | 2005-180921 | 7/2005 |
| KR | 10-2001-0110428 | 12/2001 |
| WO | WO 96/38710 | 12/1996 |
| WO | WO 98/15799 | 4/1998 |
| WO | WO 00/68640 | 11/2000 |
| WO | WO 01/44823 | 6/2001 |
| WO | WO 01/74708 | 10/2001 |

(56) References Cited

FOREIGN PATENT DOCUMENTS

| WO | 2005/121769 | 12/2005 |
|---|---|---|
| WO | 2006/010206 | 2/2006 |
| WO | 2006/103439 | 10/2006 |

OTHER PUBLICATIONS

U.S. Appl. No. 12/488,784, filed Jun. 22, 2009, Kubena.

U.S. Appl. No. 13/405,658, filed Feb. 27, 2012, Kubena.

U.S. Appl. No. 12/026,486, filed Feb. 5, 2008, Kubena.

Abe, Takashi, et al., "One-chip multichannel quartz crystal microbalance (QCM) fabricated by Deep RIE," Sensors and Actuators, vol. 82, pp. 139-143 (2000).

Barbour et al., "Micromechanical Silicon Instrument and Systems Development at Draper Laboratory," AIAA Guidance Navigation and Control Conference, 1996, Paper No. 96-3709.

Cleland, A.N., et al., "Fabrication of high frequency nanometer scale mechanical resonators from bulk Si crystals," Appl. Phys. Lett., vol. 69, No. 18, pp. 2653-2655 (Oct. 28, 1996).

Evoy, S. et al., "Temperature-dependent internal friction in silicon nanoelectromechanical systems," Appl. Phys. Lett., vol. 77, No. 15, pp. 2397-2399 (Oct. 9, 2000).

From U.S. Appl. No. 11/043,378 (now U.S. Pat. No. 7,459,099), Office Actions mailed on Aug. 11, 2006, Dec. 6, 2006, May 25, 2007, Jan. 15, 2008, and Aug. 4, 2008.

From U.S. Appl. No. 12/027,247 (now U.S. Pat. No. 8,151,640), Office Actions mailed on Jun. 7, 2011, Dec. 8, 2011 and Feb. 16, 2011.

From U.S. Appl. No. 12/636,931 (now U.S. Pat. No. 8,402,824), Office Actions mailed on Sep. 4, 2012 and Nov. 23, 2012.

Fujita et al., "Disk-shaped bulk micromachined gyroscope with vacuum sealing," Sensors and Actuators A:Physical, vol. 82, May 2000, pp. 198-204.

Greer, J.A., et al., "Properties of SAW resonators fabricated on quartz substrates of various qualities," Ultrasonics Symposium, IEEE Proceedings 1994, vol. 1, pp. 31-36 (Nov. 1-4, 1994).

Johnson et al., "Surface Micromachined Angular Rate Sensor," A1995 SAE Conference, Paper No. 950538, pp. 77-83.

Putty et al., "A Micromachined Vibrating Ring Gyroscope,", Solid State Sensor and Actuator Workshop, Transducer Research Foundation, Hilton Head, 1994, pp. 213-220.

Sirbuly, Donald J. et al., Multifunctional Nanowire Evanescent Wave Optical Sensors, Advanced Materials, 2007 (published online: Dec. 5, 2006), 19, pp. 61.

Skulski et al., "Planar resonator sensor for moisture measurements", Microwaves and Radar, 1998, MIKON '98, 12th International Conf., vol. 3, May 20-22, 1998, pp. 692-695.

Tang et al., "A Packaged Silicon MEMS Vibratory Gyroscope for Microspacecraft," Proceedings IEEE, 10th Annual Int. Workshop on MEMS, Japan, 1997, pp. 500-505.

White, Lan M., et al., Increasing the Enhancement of SERS with Dielectric Microsphere Resonators, Spectroscopy-Eugene, Apr. 2006.

Wright et al., "The HRG Applied to a Satellite Attitude Reference System," Guidance and Control, AAS, 1994, 86:1-13 and 55-67.

Yan, Fei, et al., "Surface-enhanced Raman scattering (SERS) detection for chemical and biological agents," IEEE Sensors Journal, vol. 5, No. 4, Aug. 2005.

Tang et al., "Silicon bulk micromachined vibratory gyroscope for microspacecraft," *Proc. SPIE* 2810,.Space Sciencecraft Control and Tracking in the New Millennium, 101 (Oct. 28, 1996); doi:10.1117/12.255129.

\* cited by examiner

RESONATOR ASSEMBLY COMPRISING A SILICON RESONATOR AND A QUARTZ RESONATOR

CROSS REFERENCE TO RELATED APPLICATIONS

This application is related to U.S. Pat. No. 7,581,443, issued on Sep. 1, 2009, which is hereby incorporated by reference; to U.S. Pat. No. 7,459,099, issued on Dec. 2, 2008, which is hereby incorporated by reference; to U.S. Pat. No. 8,151,640, issued on Apr. 10, 2012, which is hereby incorporated by reference; and to U.S. Pat. No. 8,402,824, issued on Mar. 26, 2013, which is hereby incorporated by reference.

This application claims the benefit of U.S. provisional application No. 61/811,636, filed on Apr. 12, 2013 and entitled "A RESONATOR ASSEMBLY COMPRISING A SILICON RESONATOR AND A QUARTZ RESONATOR", which is hereby incorporated by reference.

BACKGROUND

1. Field

This disclosure is generally related to MEMS (Micro Electro Mechanical Systems) technology assemblies, in particular a resonator assembly comprising two resonators, for example made of different materials such as a silicon resonator and a quartz resonator, for example suitable for use in an Inertial Navigation System.

2. Description of Related Art

Typically, an INS (Inertial Navigation System) in an aircraft consists of three angular rate sensors, three accelerometers, and GPS (Global Positioning System) made up electronic boards with custom ASICs (Application Specific Integrated Circuits), RF (Radio Frequency) hybrids, and commercial off-chip oscillators and filters. These components are packaged in multiple boxes which can be decoupled mechanically and thermally. An INS can in particular comprise a gyroscope and a clock.

It is known to make a gyroscope having a MEMS resonator, for example a High-Aspect-Ratio Si Resonator. A High Aspect Ratio structure as recited in the present application is a structure in which the height or thickness of the structure is much greater than lateral dimensions defined within, the structure. For example, a ring structure having a ratio height/gap spacing >2 for the rings is a High Aspect Ratio structure. An example of a High-Aspect-Ratio Si Resonator is a Si Disc Resonator Gyroscope (DRG) as described in U.S. Pat. No. 7,581,443, where the resonator layer is bonded to a Si substrate and then etched with deep reactive ion etching.

It is also known to make a MEMS quartz resonator for a quartz clock that can be bonded and integrated to a Si substrate, as described in U.S. Pat. No. 7,459,099.

U.S. Pat. No. 8,151,640 teaches using planar bonding techniques to first integrate a quartz clock resonator on a semiconductor substrate, followed by the integration of a High-Aspect-Ratio Si DRG Resonator on the substrate.

However, depending on the material used in the fabrication of the quartz resonator, the quartz resonator can be damaged or its frequency modified by the etching of the Si when forming the Si resonator. This is particularly important if the quartz resonator has Au electrodes as used commonly for HF and VHF shear-mode resonators.

There exists a need for an integrated structure comprising two resonators such that the fabrication of the later fabricated resonator does not detrimentally affects the properties of the earlier fabricated resonator.

BRIEF SUMMARY

Embodiments of the present disclosure provide for protecting a quartz resonator within a cavity, for example formed in the Si layer of a High-Aspect-Ratio Si Resonator, such that the quartz resonator remains untouched by the Si etching. The quartz resonator can thus be integrated with high quality and fidelity with a Si Resonator.

According to embodiments of the present disclosure, the protective cavity can be formed anywhere on the semiconductor substrate. Further, in embodiments where the lateral dimensions of the quartz clock are such that it fits within the base mount area of the Si Resonator active layer, the cavity that receives the quartz resonator can be advantageously located inside the base of the Si Resonator. This provides for ultra-tight packaging and coupling for reducing thermal gradients and thermal transients between the devices for precise error correction.

An embodiment of the present disclosure relates to a resonator assembly comprising: a semiconductor substrate; a resonator gyroscope, the resonator gyroscope including a first resonator formed in a layer of a first material; and an oscillator on the semiconductor substrate, the oscillator including a second resonator formed of a second material; the second resonator being attached in a cavity; the cavity comprising a first recess in said layer of a first material and the edges of the first recess being attached to the substrate, or the cavity comprising a second recess in said substrate and the edges of the second recess being attached to said layer of a first material.

Alternatively, an embodiment of the present disclosure relates to a resonator assembly comprising: a semiconductor substrate; a first resonator formed in a layer of a first material; and a second resonator formed of a second material; the second resonator being attached in a cavity; the cavity comprising a first recess in said layer of a first material and the edges of the first recess being attached to the substrate, or the cavity comprising a second recess in said substrate and the edges of the second recess being attached to said layer of a first material.

According to an embodiment of the present disclosure, the first resonator comprises a central mounting stem, and wherein the cavity is located in said central mounting stem.

According to an embodiment of the present disclosure, the assembly comprises a common heater centrally located beneath the first and second resonators.

According to an embodiment of the present disclosure, the first material is silicon and the second material is quartz.

According to an embodiment of the present disclosure, the second resonator is a SC-cut shear-mode quartz resonator.

According to an embodiment of the present disclosure, the quartz resonator has electrodes comprising gold.

According to an embodiment of the present disclosure, the cavity comprises vent ports.

According to an embodiment of the present disclosure, the two resonators are vacuum sealed in a common housing.

According to an embodiment of the present disclosure, heaters are placed on the outside surface of the common housing.

Another embodiment of the present disclosure relates to a process for a resonator assembly, the process comprising: providing a semiconductor substrate; providing a layer of a first material; etching at least part of a cavity in said layer of first material or in said substrate; attaching an oscillator on the semiconductor substrate, the oscillator including a first resonator formed of a second material; and assembling said layer of first material on said substrate such that the second resonator is enclosed in said cavity; the process further comprising forming a second resonator out of said layer of a first material by etching said layer of a first material, wherein said cavity is located below a portion of said layer of a first material that is not etched.

According to an embodiment of the present disclosure, said forming a second resonator comprises forming a second resonator having a central mounting stem; the cavity being located in said central mounting stem.

According to an embodiment of the present disclosure, the process comprises forming a common heater centrally located beneath the first and second resonators.

According to an embodiment of the process, the first material is silicon and the second material is quartz.

According to an embodiment of the process, the second resonator is a SC-cut shear-mode quartz resonator.

According to an embodiment of the process, the quartz resonator has electrodes comprising gold.

According to an embodiment of the process, said assembling said layer of first material on said substrate such that the second resonator is enclosed in said cavity comprises providing the cavity with vent ports.

According to an embodiment of the process, the process further comprises vacuum sealing the two resonators in a common housing.

According to an embodiment of the process, the process further comprises arranging heaters on the outside surface of the common housing.

DETAILED DESCRIPTION

Figure 1A:
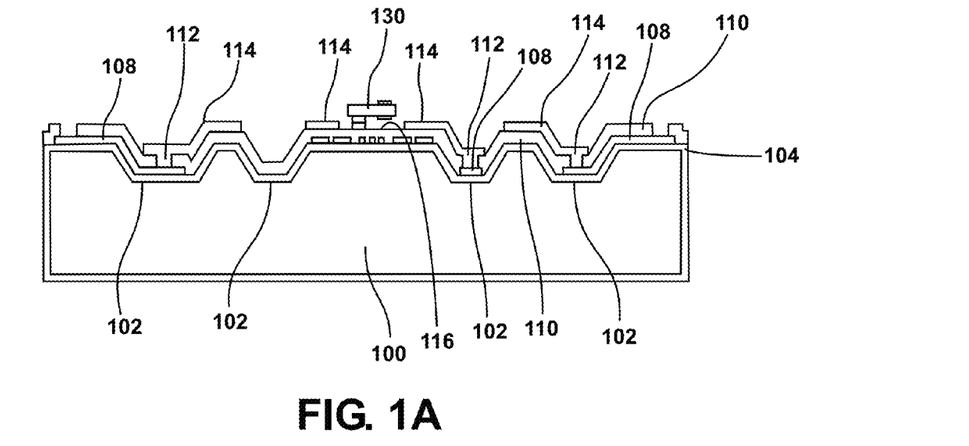
FIGS. 1A-C show three steps of the fabrication of an on-chip resonator assembly comprising a quartz resonator under the central base of a Si DRG resonator in accordance with the present disclosure.

FIG. 1A shows a substrate 100 that can be composed of a semiconductor material, such as silicon, SiGe, or a group III-V material. Typically, this substrate can be previously fabricated with built-in circuitry such as signal processors and/or GPS. One or more recesses 102 were etched in the substrate 100 to provide geometry for the components to be added to the substrate 100. Alternatively, the recesses 102 can be formed by depositing additional layers upon the substrate 100 surrounding the recessed areas 102. The geometry can provide connection between later-added top-side components (such as the DRG and the quartz oscillator) and the substrate 100 circuitry.

A thermal oxide layer 104 was deposited on the substrate 100. Top-side vias (not shown) can be etched or otherwise provided to allow access to the substrate 100 by depositing conductive material in the vias. This is especially important if there are going to be further components in or under the substrate 100 (such as GPS and/or signal processing circuitry in the substrate).

Metal interconnects 108 were deposited over the thermal oxide layer 104 and a dielectric 110 was deposited over the exposed surface with one or more vias 112 etched in the dielectric 110 to allow access to the metal interconnects 108. Bond metal 114 was deposited on the dielectric 110 and through the vias 112 to provide connection points for the top-side components of the assembly, such as the DRG and the quartz oscillator. In the embodiment presently disclosed, the DRG comprises a resonator with a central base, and a portion of the bond metal layer 114 provided for contacting the central base of the DRG resonator comprises an opening exposing an area 116 of the dielectric 110.

A quartz oscillator resonator 130 was fabricated as disclosed in relation with FIGS. 2A-2I of U.S. Pat. No. 8,151,640, and assembled on area 116 as disclosed in relation with FIGS. 2J-2M of U.S. Pat. No. 8,151,640. The Assembly shown in FIG. 1A is fabricated essentially as the assembly described in relation with FIGS. 4A-4G of U.S. Pat. No. 8,151,640, except for the assembly of resonator 130 on area 116.

Figure 1B:
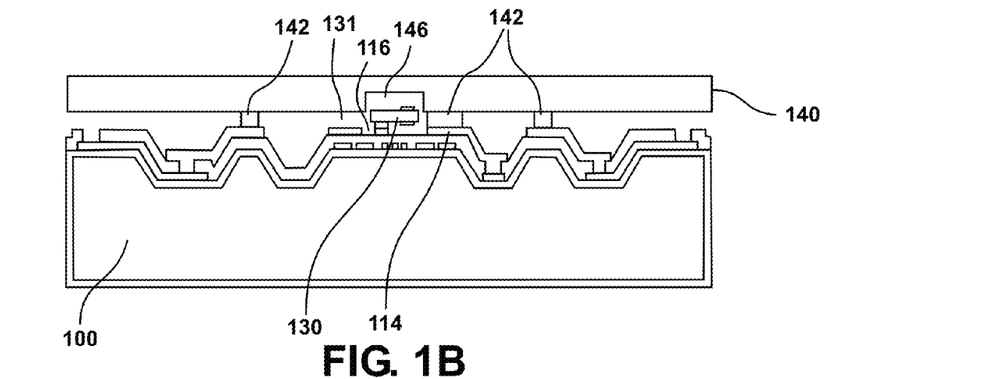

FIG. 1B shows a gyroscope resonator wafer 140 assembled to the bond metal layer 114 of FIG. 1A via a further bond metal layer 142 that was previously deposited on the resonator wafer 140 in a pattern for forming a disk resonator gyroscope (DRG). The material of wafer 140 can be the same as the material that the resonator 130 is composed of, or can be a different material.

In the embodiment illustrated, the two materials are different. Wafer 140 is silicon and resonator 130 is quartz. Alternatively, the wafer 140 could be made of quartz and/or the resonator 130 could be made of Silicon.

In the embodiment presently disclosed, the wafer 140 was etched so that it provides a recess 146 above area 116. Recess 146 was formed in the portion of the wafer 140 that is to become the central base of the resonator formed in wafer 140. The wafer 140 was then arranged such that the edges of recess 146 are attached to the substrate 100 by the bond metal layers 114 and 142 around area 116. The resonator 130 is thus enclosed in a cavity formed by recess 146, area 116 and the portions of bond metal layers 114 and 142 around area 116.

It is noted that instead of having a flat area 116 and a wafer 140 having a recess 146, area 116 could comprise a recess and wafer 140 could be flat to form the cavity that encloses the resonator 130, or both area 116 and wafer 140 could comprise a recess to form the cavity that encloses the resonator 130.

A circuitry wafer (not shown) containing, for example, analog/digital low-powered CMOS circuitry for additional components, such as a GPS and/or a signal processor, can optionally be bonded to the opposite side of the substrate 100.

Since the oscillator 130 could be damaged by excessive heat, the resonator wafer 140 is preferably bonded to the bond metal layer 114 using a low-temperature bonding technique, such as Au—In compression bonding or Au—Sn compression bonding. In the Au—In thermal compression bonding scheme, the components are heated to a temperature of about 100 degree Celsius to 300 degree Celsius in a vacuum having a pressure no greater than $10^{-4}$ Torr. Then the bond metal pads 142, 114 of the components may be pressed together, while being depressurized, with a pressure of approximately 1 MPa.

Figure 1C:
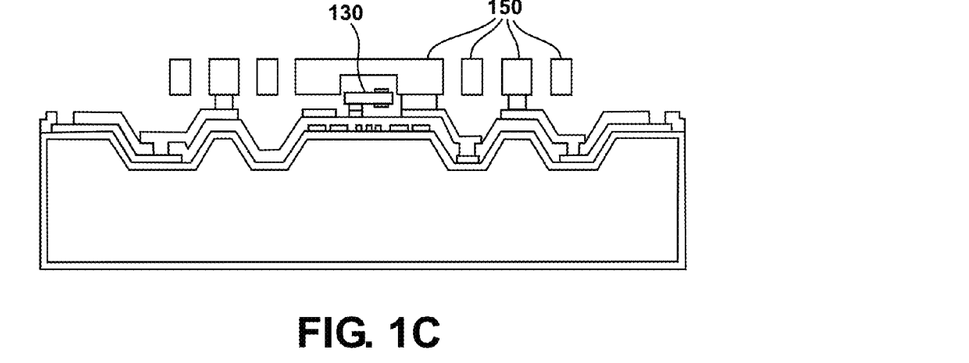

FIG. 1C depicts the resonator wafer 140 having been etched in a pattern to create a DRG resonator 150 (as for example illustrated in FIG. 4M of U.S. Pat. No. 8,151,640). Resonator 150 can comprise a system of interconnected rings supported at a central support with internal drive and sense electrodes formed from material left in circumferential slots of resonator; the drive and sense electrodes generally interacting with the disc resonator 150 in the plane of the resonator across narrow gaps between the electrodes and the resonator structure.

In the embodiment presently disclosed, the oscillator resonator 130 is enclosed in a cavity below a portion of the wafer 140 that corresponds to the base of the resonator 150, which is therefore not etched when forming the DRG resonator 150. The oscillator resonator 130 is thus protected from the etching process that etches the DRG resonator 150 material. Because the oscillator resonator 130 is protected from the etching process, the oscillator 130 can be composed of a material that would otherwise be degraded by the etching process.

Further, because the oscillator resonator 130 is protected from the etching process, the electrodes and conductive interconnects for the oscillator 130 can comprise a metal that would otherwise be degraded by the etching process. For example, the DRG resonator 150 can be etched using a deep reactive ion etching (DRIE) process, such as a fluorine-based plasma DRIE process, and the electrodes and conductive interconnects for the oscillator 130 can comprise gold, which would be degraded by such a process.

It is noted that, alternatively to vacuum-sealing the cavity holding resonator 130, vent holes 131 can be provided in the seal ring formed by the bond metal pads 142, 114, to allow a subsequent vacuum packaging of the resonator 130 and the resonator 150 simultaneously in a common vacuum housing. The vent holes would then be provided so that the etching process that etches the DRG resonator 150 out of wafer 140 does not detrimentally affect the resonator 130.

It is also noted that, whereas in the embodiment presently disclosed, the DRG comprises a resonator 150 having a central base and the cavity enclosing the resonator 130 is formed in the thickness of the central base, said cavity can alternatively be formed in a location different from the central base of resonator 150. The cavity can be formed below any portion of the wafer 140 that will not be etched to form the DRG resonator 150. For example, a portion of wafer 140 that would otherwise have been etched away when forming resonator 150 can be maintained un-etched to cover a cavity enclosing the resonator 130. The maintained un-etched portion of wafer 140 covering the cavity would then be chosen so as to not impair the proper operation of resonator 140.

Figure 1D:
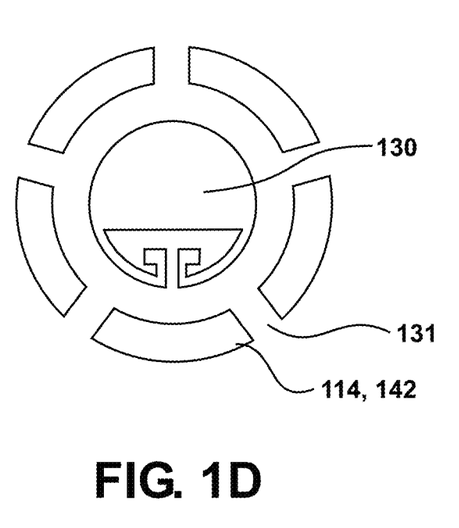
FIG. 1D is a top view of the quartz resonator enclosed in the cavity of FIGS. 1B-C in accordance with the present disclosure.

FIG. 1D is a top view showing the quartz resonator 130 and the seal ring formed by the bond metal pads 142, 114, with vent holes 131 can be provided in the seal ring.

Figure 1E:
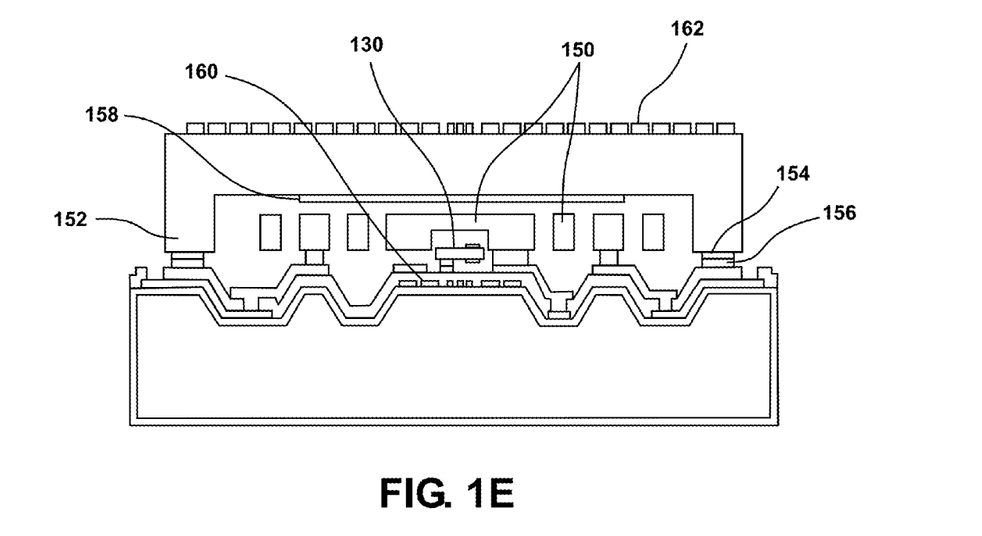
FIG. 1E depicts a final ovenized tightly-coupled integrated quartz clock and Si DRG as illustrated in FIGS. 1A-D in a wafer-level vacuum package with a top heater on a top capping Si layer in accordance with the present disclosure.

FIG. 1E shows a sealed cover 152 attached over the components on substrate 100. The cover 152 can include a mating seal ring 154 to be aligned and bonded to a base seal ring 156 on substrate 100. A getter 158 can optionally be placed on an inside surface of the cover to absorb free gases if the area sealed by the cover is under vacuum. The getter 158 can be Ti-based, but the utilization of other getter materials are well known in the art. In addition to protecting the components from dust and humidity from the environment, the cover 152 also helps ensure that environmental changes (temperature, vibration, etc.) to one component within the sealed area is approximately the same as the environmental change in other components within the sealed area.

Advantageously, a common heater 160 can be arranged in the substrate under area 116, and can efficiently heat both resonator 130 and resonator 150 under cover 152, thus reducing the power needed and reducing thermal gradient and thermal transients between resonator 130 and resonator 150 for ovenized operation. The heater can be a line or a coil of resistive material that generates heat when a current is run through it. The heater can alternatively be located on a platform isolated from the substrate. This allows providing heat to the resonators without losing power in the substrate, thus allowing a lower power operation. An isolated platform can be manufactured by etching away a portion of the substrate below a layer of material, thus forming a membrane connected to the substrate by only edge contact points.

A further heater 162 can be arranged on an external surface of cover 152 for ovenized operation. A further heater (not shown) can also alternatively or additionally be arranged on the bottom of the substrate. One or more compliant stand-off (not shown) can be provided, for example on the bottom of the substrate, for mounting the substrate; for example in a housing or package, or on a board comprising various elements (not shown) such as a Clapp sustaining circuit for the quartz oscillator, or closed loop electronics for the Si DRG.

If resonator 130 is a SC-cut quartz resonator, the entire housing can be heated to approximately 80° C. for optimized stability since the SC-cut resonator has a minimal frequency sensitivity to temperature changes in this temperature range. As outlined above, the protective recess 146 can be bonded to the semiconductor substrate using vent holes within the seal ring in order to allow venting of the trapped gas during the High-Aspect-Ratio Si Resonator vacuum packaging. High-aspect-ratio (>10) Si DRGs have been shown to operate with highest Q for vacuum pressures <1 mT. High performance quartz clocks also require mT or sub-mT vacuums to prevent frequency drifts and instabilities due to residual gas adsorbing or desorbing from the surface. Thus, the vacuum requirements for both high Q DRGs and high quartz clock stability are similar and can be met with a single vacuum environment.

Typical thicknesses of mm-size Si DRG Resonators are from about 100 to 250 microns while typical thicknesses of the shear-mode quartz resonators are 1-100 microns. Moreover, the lateral mounting stem diameter for 8 mm-diameter Si DRGs is about 2 mm while the lateral quartz plate dimensions for many VHF quartz resonators is 1 mm or less. Thus, for many designs of the Si DRG and the quartz resonators, the quartz resonator can be enclosed in a protective Si cavity made from the same active Si layer used to form the Si DRG Resonator. This simplifies the processing steps and provides the ability to use thicker, lower frequency quartz resonators with Au electrodes for higher stability clocks. Without the protective cavity, the quartz electrodes must have a very high etch selectivity compared to Si during the deep reactive ion etching of the High-Aspect-Ratio Si Resonator, as disclosed in U.S. Pat. No. 8,151,640. This necessitates using electrodes such as Al which does not provide a high level of energy trapping for high Q HF or VHF quartz resonators.

Figure 1F:
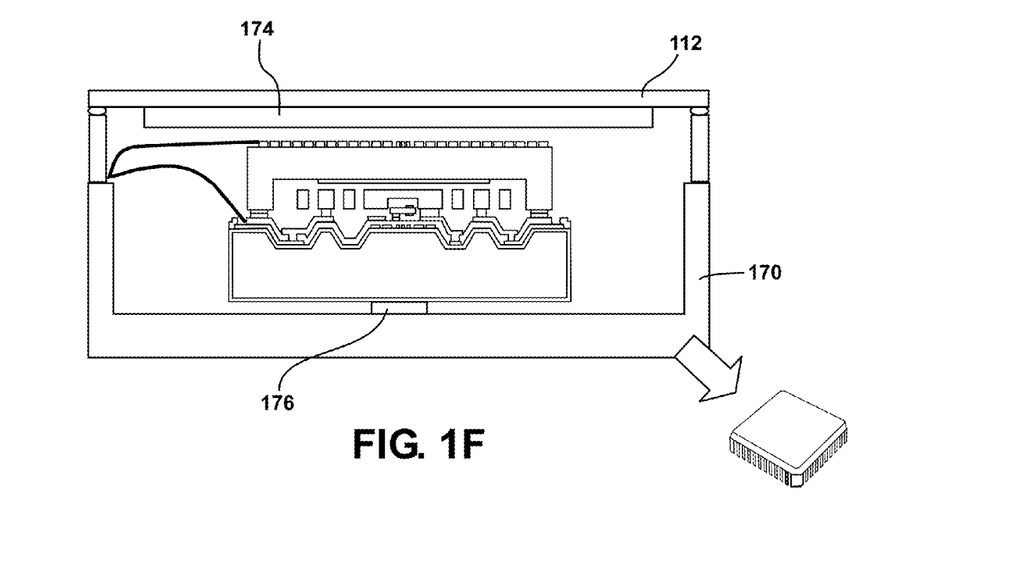
FIG. 1F depicts a final ovenized tightly-coupled integrated quartz clock and Si DRG in a LCC vacuum packaged in accordance with the present disclosure.

FIG. 1F shows the sealed assembly of FIG. 1E arranged in a vacuum sealed LLC-type package 170 having a lid 172. A getter 174 is provided inside package 170, for example on the interior surface of lid 172. It is noted that, when the assembly of FIG. 1E is arranged in such package, cover 152 does not need to be vacuum sealed and getter 158 does not need to be provided in cover 152. Vents (not shown) comparable to vents 130 can then be provided in base seal ring 156. Top heaters (not shown) can be added to the lid to ensure isothermal heating of the package. The bottom of the substrate comprises a compliant stand-off 176 for mounting the substrate in package 170.

It is noted that the assembly disclosed above can be used advantageously to fabricate an integrated Inertial Navigation System having reduced size, weight and power consumption. Aircrafts manufacturers have many needs for INSes allowing precision navigation for missiles and aircraft. Especially on Unmanned Aerial Vehicles, the navigation package needs to be small, lightweight, and low power.

In addition, as autonomous vehicles become more prevalent on public roads, on-board GPS navigation system coupled to an INS will become more important for automobile companies. In the event of a loss in the GPS signal, local navigation from on-board systems will be important. Small, low cost precision navigation can prevent missed turns and guidance errors with meter accuracy for several minutes during GPS outages.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art.

For example, the fabrication of an oscillator resonator protected by a cavity enclosed by the wafer of a DRG resonator are disclosed hereabove, but the present disclosure also contemplates providing more than one cavity and/or protecting other MEMS than an oscillator resonator in the one or more cavity, the wafer being etched to form a MEMS other than a DRG resonator.

All such modifications and variations are intended to be included herein within the scope of this disclosure. The present invention is intended to be protected by the following claims.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is the following:

1. A resonator assembly comprising:
   a semiconductor substrate;
   a resonator gyroscope, the resonator gyroscope including a first resonator formed in a layer of a first material; and
   an oscillator on the semiconductor substrate, the oscillator including a second resonator formed of a second material;
   the second resonator being attached in a cavity; the cavity comprising a first recess in said layer of a first material and the edges of the first recess being attached to the substrate, or the cavity comprising a second recess in said substrate and the edges of the second recess being attached to said layer of a first material;
   said first resonator being formed by etching said layer of a first material after said attaching the edges of the first recess to the substrate or said attaching the edges of the second recess to said layer of a first material; and
   said cavity being located below a portion of said layer of a first material that is not etched when forming said first resonator.

2. The assembly of claim 1, wherein the first material is silicon and the second material is quartz.

3. The resonator assembly of claim 2, wherein the second resonator is a SC-cut shear-mode quartz resonator.

4. The resonator assembly of claim 2, wherein the quartz resonator has electrodes comprising gold.

5. The resonator assembly of claim 1, wherein the cavity comprises vent ports.

6. The resonator assembly of claim 5, in which the two resonators are vacuum sealed in a common housing.

7. The resonator assembly of claim 6 in which heaters are placed on the outside surface of the common housing.

8. The assembly of claim 1, wherein the cavity comprises said first recess in said layer of a first material and the edges of said first recess are attached to the substrate; said first resonator being formed by etching said layer of a first material after said attaching the edges of said first recess to the substrate.

9. The assembly of claim 1, wherein the cavity comprises said second recess in said substrate and the edges of said second recess are attached to said layer of a first material; said first resonator being formed by etching said layer of a first material after said attaching the edges of said second recess to said layer of a first material.

10. The assembly of claim 1, wherein the cavity comprises said first recess in said layer of a first material and said second recess in said substrate, the edges of said first recess and said second recess being attached together; said first resonator being formed by etching said layer of a first material after said attaching the edges of said first recess to the edges of said second recess.

11. The assembly of claim 1, wherein the cavity comprises said first recess in said layer of a first material and said second recess in said substrate, the edges of said first recess and said second recess being attached together.

12. A resonator assembly comprising:
    a semiconductor substrate;
    a resonator gyroscope, the resonator gyroscope including a first resonator formed in a layer of a first material; and
    an oscillator on the semiconductor substrate, the oscillator including a second resonator formed of a second material;
    the second resonator being attached in a cavity, the cavity comprising a first recess in said layer of a first material and the edges of the first recess being attached to the substrate, or the cavity comprising a second recess in said substrate and the edges of the second recess being attached to said layer of a first material, wherein the first resonator comprises a central mounting stem, and wherein the cavity is located in said central mounting stem.

13. The resonator assembly of claim 12, comprising a common heater centrally located beneath the first and second resonators.

14. The assembly of claim 12, wherein the cavity comprises said first recess in said layer of a first material and the edges of said first recess are attached to the substrate.

15. The assembly of claim 12, wherein the cavity comprises said second recess in said substrate and the edges of said second recess are attached to said layer of a first material.

16. A fabrication process for a resonator assembly, the process comprising:
- providing a semiconductor substrate;
- providing a layer of a first material;
- etching at least part of a cavity in said layer of first material or in said substrate;
- attaching an oscillator on the semiconductor substrate, the oscillator including a first resonator formed of a second material; and assembling said layer of first material on said substrate such that the first resonator is enclosed in said cavity;
- the process further comprising:
- forming a second resonator out of said layer of a first material by further etching said layer of a first material after said assembling, wherein said cavity is located below a portion of said layer of a first material that is not etched by said further etching.

17. The process of claim 16, wherein said forming a second resonator comprises forming a second resonator having a central mounting stem; the cavity being located in said central mounting stem.

18. The process of claim 17, comprising forming a common heater centrally located beneath the first and second resonators.

19. The process of claim 16, wherein the first material is silicon and the second material is quartz.

20. The process of claim 19, wherein the second resonator is a SC-cut shear-mode quartz resonator.

21. The process of claim 19, wherein, wherein the quartz resonator has electrodes comprising gold.

22. The process of claim 16, wherein said assembling said layer of first material on said substrate such that the second resonator is enclosed in said cavity comprises providing the cavity with vent ports.

23. The process of claim 22, further comprising vacuum sealing the two resonators in a common housing.

24. The process of claim 23, further comprising arranging heaters on the outside surface of the common housing.

25. The process of claim 16, comprising etching said cavity in said layer of first material.

26. The process of claim 16, comprising etching said cavity in said substrate.

27. The process of claim 16, comprising etching a first part of said cavity in said layer of first material and a second part of said cavity in said substrate.

* * * * *